(12) United States Patent
Pamarti et al.

(10) Patent No.: US 8,890,618 B2
(45) Date of Patent: Nov. 18, 2014

(54) ZERO-VOLTAGE-SWITCHING CONTOUR BASED OUTPHASING POWER AMPLIFIER

(71) Applicant: The Regents of the University of California, Oakland, CA (US)

(72) Inventors: Sudhakar Pamarti, Los Angeles, CA (US); Nitesh Singhal, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/162,404

(22) Filed: Jan. 23, 2014

(65) Prior Publication Data

US 2014/0203871 A1    Jul. 24, 2014

Related U.S. Application Data

(63) Continuation of application No. PCT/US2012/049075, filed on Jul. 31, 2012.

(60) Provisional application No. 61/513,625, filed on Jul. 31, 2011.

(51) Int. Cl.
*H03F 3/68*    (2006.01)
*H03F 3/217*    (2006.01)

(52) U.S. Cl.
CPC .................................. *H03F 3/2176* (2013.01)
USPC ....................................... 330/295; 330/124 R (58) Field of Classification Search
CPC ......................................................... H03F 3/68
USPC ................................ 330/295, 124 R, 84, 126
See application file for complete search history.

(56) References Cited

U.S. PATENT DOCUMENTS

| | | | | |
|---|---|---|---|---|
| 3,769,586 | A * | 10/1973 | Shapiro et al. | 455/129 |
| 5,568,087 | A * | 10/1996 | Gatti | 330/149 |
| 5,955,926 | A * | 9/1999 | Uda et al. | 330/295 |
| 6,225,865 | B1 * | 5/2001 | Muterspaugh | 330/51 |
| 7,786,797 | B2 * | 8/2010 | Okazaki et al. | 330/124 R |

* cited by examiner

*Primary Examiner* — Henry Choe
(74) *Attorney, Agent, or Firm* — John P. O'Banion (57) ABSTRACT

A zero-voltage-switching contour based outphasing power amplifier having two class-E power amplifiers connected in an out-phasing architecture coupled on opposite sides of a load being driven. The pair of class-E power amplifiers receive separate digital drive signals with an amount of phase difference that is adjusted based on the load. Variable capacitor arrays are coupled in parallel on the class-E power amplifiers and controlled in response to system parameters including duty cycle of the input signal. Efficiency of the power amplifier is maintained despite variation in output loading.

20 Claims, 5 Drawing Sheets

ZERO-VOLTAGE-SWITCHING CONTOUR BASED OUTPHASING POWER AMPLIFIER

CROSS-REFERENCE TO RELATED APPLICATIONS

This application is a 35 U.S.C. §111(a) continuation of PCT international application number PCT/US2012/049075 filed on Jul. 31, 2012, incorporated herein by reference in its entirety, which claims priority to U.S. provisional patent application Ser. No. 61/513,625 filed on Jul. 31, 2011, incorporated herein by reference in its entirety.

The above-referenced PCT international application was published as PCT International Publication No. WO 2013/019819 on Feb. 7, 2013 and republished on Jul. 4, 2013, which publications are incorporated herein by reference in their entireties.

STATEMENT REGARDING FEDERALLY SPONSORED RESEARCH OR DEVELOPMENT

This invention was made with Government support under Grant No. 0725785 awarded by the National Science Foundation. The Government has certain rights in the invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to power amplifiers, and more particularly to a zero voltage switching (ZVS) contour based switching power amplifier having a wide dynamic range.

2. Description of Related Art

There are two types of power amplifiers; linear and switching. Linear power amplifiers (PAs), such as class A, B, and AB amplifiers, are biased for peak output power and consequently suffer from poor efficiency at backed-off power levels. A common design approach used to obtain the desired linearity for a PA is to design the PA to handle more power than the level at which it will be operating. This is called "power back-off", and the differential between design output and operating output is typically expressed in dB. There are also techniques that have improved the efficiency of linear PAs, such as found in transformer combiner based PAs and envelope tracking PAs. However, a transformer combiner based PA is limited by die size constraints, and envelope tracking PAs suffer from supply regulator bandwidth and efficiency problems.

Architectures used in switching PAs, such as supply modulation (e.g., polar, polar loop), theoretically offer high efficiency even at very low output power levels. Yet, these architectures suffer from supply regulator inefficiency, particularly while handling wide bandwidth envelope variations. Recently developed digital PA architectures, such as the digital envelope modulator and the switching mixer PA architectures, all suffer from efficiency degradation at backed-off power levels. Duty cycle modulation and dynamic load modulation, such as used for class-E PAs, can achieve high peak efficiency but results in poor efficiency at low output power levels. In fact, class-E PAs operate sub-optimally at low output power levels when zero voltage switching (ZVS) conditions are not satisfied, thus resulting in significant losses and poor efficiency. It will be appreciated that ZVS is intended to maximize efficient operation of class-E PAs.

BRIEF SUMMARY OF THE INVENTION

The present invention is an outphasing zero voltage switching ZVS contour based power amplifier (PA) with a wide dynamic range. By way of example, and not of limitation, an embodiment of the inventive amplifier comprises a pair of separate power amplifiers (PAs) connected in an out-phasing architecture and coupled to opposite ends of a load, or a power combiner, (e.g., a transformer), coupled to a load. In the preferred embodiment, the pair of PAs are configured for zero voltage switching (ZVS), and arrays of variable capacitors are controlled in response to the duty cycle of the input drive signals whose relative phase is also changed based on the duty cycle. This inventive amplifier architecture provides a number of advantages over prior amplifier systems, including wide dynamic range.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DETAILED DESCRIPTION OF THE INVENTION

Our inventive outphasing ZVS contour based power amplifier (PA) architecture is based on the ZVS contour based PA.

In a ZVS contour based PA, peak efficiency is maintained even under back-off conditions by a circuit configuration with select component values, such that ZVS conditions are met at varying duty cycles. Specifically, this involves varying the drain capacitance C and the equivalent resistance $R_{eq}$ for a fixed zero voltage switching transistor drain inductance $L_{zvs}$ along with duty cycle D according to the following relation:

$$\frac{\omega_0 L_{ZVS}}{R_{eq}} = g_1(D)$$

and $$\omega_0 C R_{eq} = g_2(D)$$

in which $g_1(D)$ and $g_2(D)$ are determined, such as analytically or empirically to ensure ZVS switching. The resultant output power varies with the duty cycle D according to the following relation:

$$P_{out}(D) = g_3(D) \cdot \frac{V_{DD}^2}{R_{eq}}$$

The functions $g_1(D)$ and $g_2(D)$ and $g_3(D)$ can be found as solutions to a set of equations that can be analytically derived, or empirically determined as described in a later section.

Conventional class-E power amplifiers can utilize dynamically programmable reactive termination of outphasing PAs, but do not guarantee ZVS and hence lack efficiency and wide dynamic range. In addition, although the driving waveforms of a conventional ZVS contour based PA can have some phase modulation, its envelope dynamic range or power back-off range is also limited by the achievable load modulation. To overcome these problems, the single ZVS contour based class-E PA is replaced by two ZVS contour based class-E PAs, connected in an out-phasing architecture.

Figure 1:
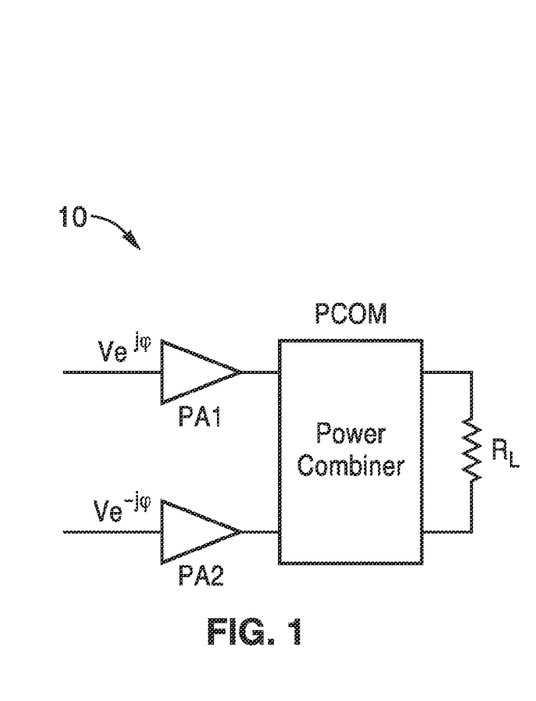
FIG. 1 is a schematic diagram illustrating an outphasing power-amplifier (PA).

FIG. 1 illustrates a simplified schematic 10 of an outphasing PA architecture. The embodiment shown comprises two identical, parallel class-E PA networks PA1 and PA2 with a phase difference of $2\phi$ between their input voltages $Ve^{j\Phi}$ and $Ve^{-j\Phi}$. The output from the PA networks is directed to a power combiner circuit PCOM, which can take various forms such as a transformer, that drives load $R_L$. It will be noted that the inputs are said to have phases of $\phi$ and $-\phi$, thus the difference between them is $2\phi$. It should be appreciated that in conventional outphasing, the PA does not have to be a class E amplifier; whereby the amplifier could be a class A/B/AB or even a class D amplifier. This phase difference between the input voltages presents an effective impedance of $Z_1$ and $Z_2$ to the two PAs, which are found to be:

$$Z_1 = \frac{(V\cos\varphi + jV\sin\varphi)}{j2V\sin\varphi} R_L$$
$$= \frac{R_L}{2}(1 - j\cot\varphi)$$

$$Z_2 = \frac{(-V\cos\varphi + jV\sin\varphi)}{j2V\sin\varphi} R_L$$
$$= \frac{R_L}{2}(1 + j\cot\varphi)$$

Hence as can be seen, a varying output load can be supported by merely varying the phase difference $\phi$ between these input voltages $Ve^{j\Phi}$ and $Ve^{-j\Phi}$. It will be noted that j refers to a so-called imaginary number as the square root of negative one. Imaginary numbers allows the real number system R to be extended to the complex number system C, which in turn provides at least one root for every polynomial P(x), and is noted herein by j. In mathematics, the term "imaginary" was used because there is no real number having a negative square, but the use of these numbers is common and necessary in solving many system problems.

Figure 2A:
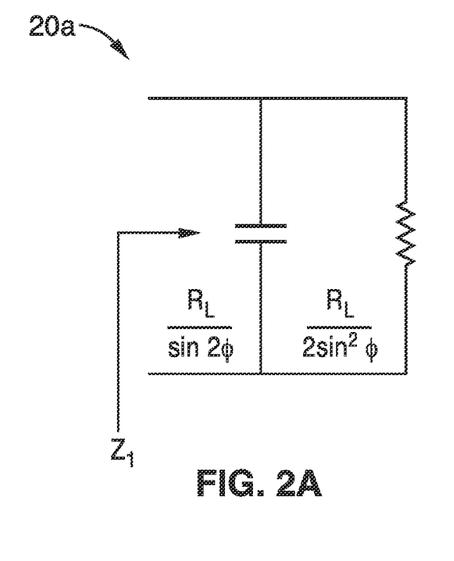
FIG. 2A and FIG. 2B are schematic diagrams showing the effective load impedance seen by two different power amplifiers according to an embodiment of the present invention.
Figure 2B:
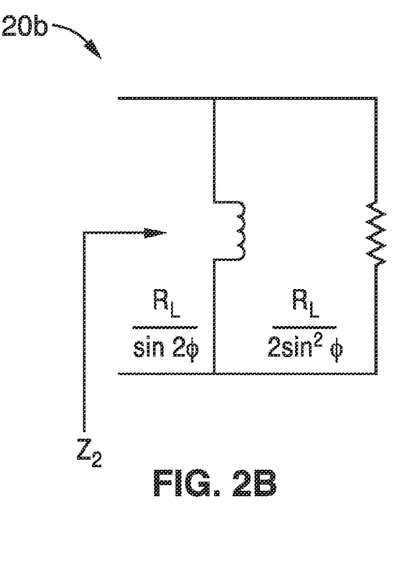

FIG. 2A and FIG. 2B show these equivalent impedances for $Z_1$ 20a and $Z_2$ 20b after a series-to-parallel transformation. These equivalent impedances are seen for $Z_1$ 20a in FIG. 2A as a parallel combination of capacitor and resistor, with contributions $R_L/\sin 2\phi$, and $R_L/2 \sin^2 \phi$, respectively. Similarly, the equivalent impedances are seen for $Z_2$ 20b in FIG. 2B as a parallel combination of inductor and resistor, with contributions $R_L/\sin 2\phi$, and $R_L/2 \sin^2 \phi$, respectively. It should be noted that if $\phi$ is allowed to become negative, the capacitor and inductor have to be interchanged.

In the present invention, for every duty cycle D, the drain capacitance value C(D), the relative phase ($2\phi$), and the tunable networks are chosen such that ZVS conditions are satisfied for both class E PAs. The variable drain capacitor values, C(D), are chosen to satisfy the ZVS conditions as specified by the function $g_2(D)$. The relative phase ($2\phi$) is chosen such that the resistance seen by the PAs, namely the real parts of $Z_1$ and $Z_2$, satisfy the ZVS conditions as specified by the function $g_1(D)$. The tunable reactive networks are chosen, such that the imaginary parts of $Z_1$ and $Z_2$ are resonated out at the PA's center frequency. In effect, for each duty cycle value D, a different and unique output power, as specified by $g_3(D)$, is delivered while maintaining ZVS conditions and hence high efficiency. The relation between the duty cycle D and the output power can be derived analytically or empirically and used to map desired output power level (or desired back-off from nominal peak output power) to a required duty cycle value.

It is important to realize that a key aspect of the invention is operating the out-phasing PA along ZVS contours within its design space. ZVS conditions ensure that just as the transistor turns ON during each carrier period, the drain voltage is at zero, thereby avoiding any wasted power in discharging the drain. The ZVS contour PA is based on meeting ZVS conditions toward reaching optimal efficiency in a parallel class-E PA, not only at a particular power level, but also at backed-off power levels by a simultaneous modulation of the duty cycle, drain capacitance and load.

Figure 3A:
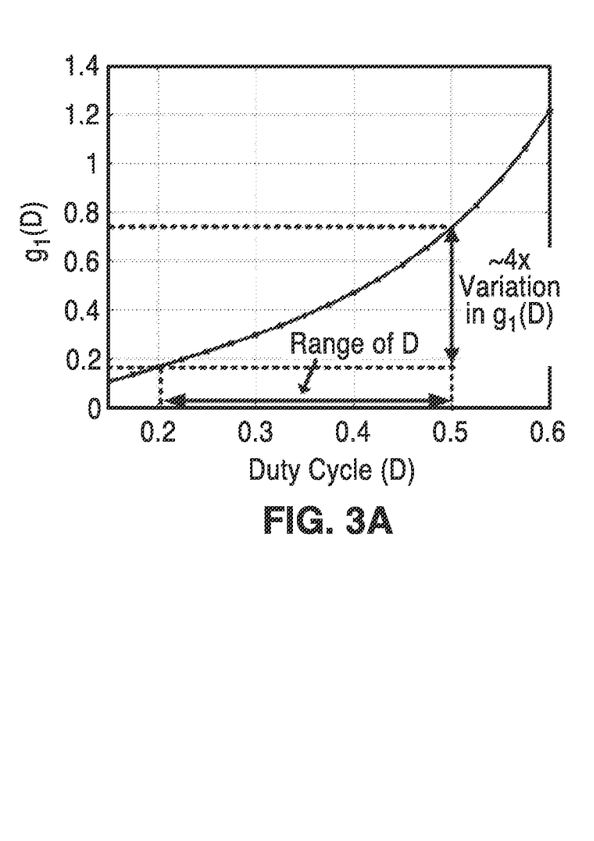
FIG. 3A through FIG. 3C are graphs of circuit response to changes in duty cycle according to an embodiment of the present invention.
Figure 3B:
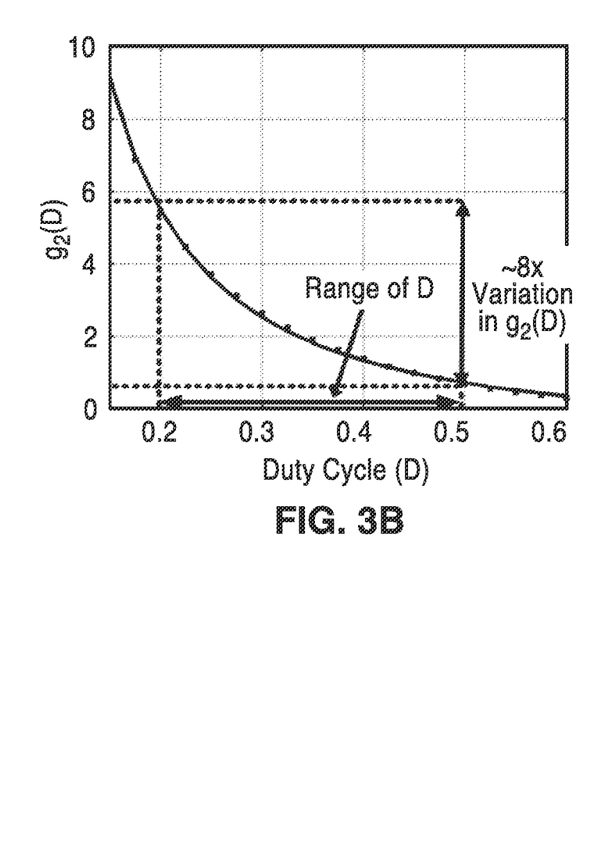

FIG. 3A and FIG. 3B illustrate plots of $g_1$ and $g_2$ as a function of duty cycle D for a given configuration of the amplifier. From these plots the following curve fitting equations were determined:

$$g_1(D) = 218.3D^6 - 431.1D^5 + 355.3D^4 - 148.3D^3 + 33.45D^2 - 2.677D + 0.105$$

$$g_2(D) = 0.4752D^{-1.596} - 0.7232$$

Figure 3C:
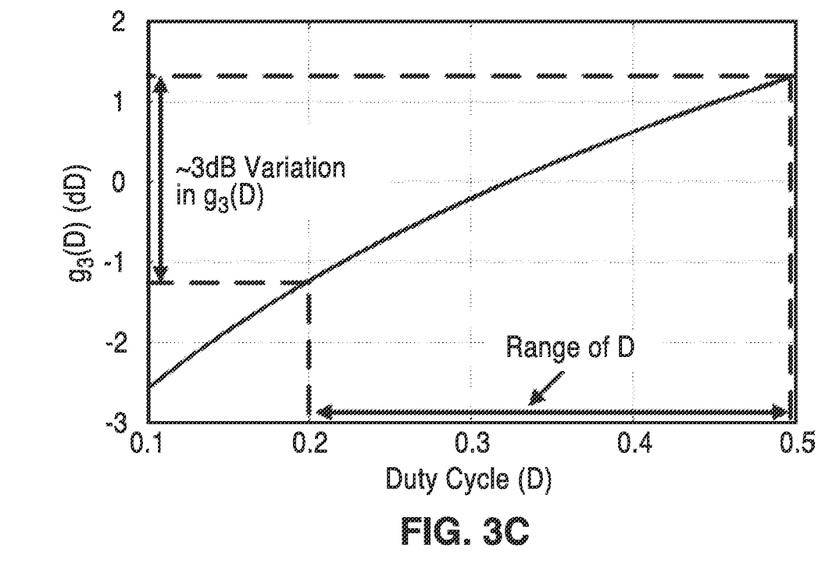

FIG. 3C similarly illustrates a plot of $g_3$ as a function of duty cycle D for a given configuration of the amplifier, from which curve fitting arrives at the following equation for $g_3(D)$:

$$g_3(D) = 2.714D$$

The above equations for $g_1(D)$, $g_2(D)$ and $g_3(D)$ are valid, to the first order, for a general class-E PA design (with a finite drain inductance) assuming: (a) instantaneous switching, (b) zero switch ON resistance, and (c) disregarding higher order switching harmonics.

Although values of $g_1(D)$, $g_2(D)$ and $g_3(D)$ will vary for any specific implementation, a useful design would still result, however, with somewhat less efficiency. While not necessary, for any specific configuration, a designer can analytically, or from circuit simulations, derive and plot these functions in response to duty cycle and create a set of equations expressing optimum values of $g_1(D)$, $g_2(D)$ and $g_3(D)$ for that configuration.

Figure 4:
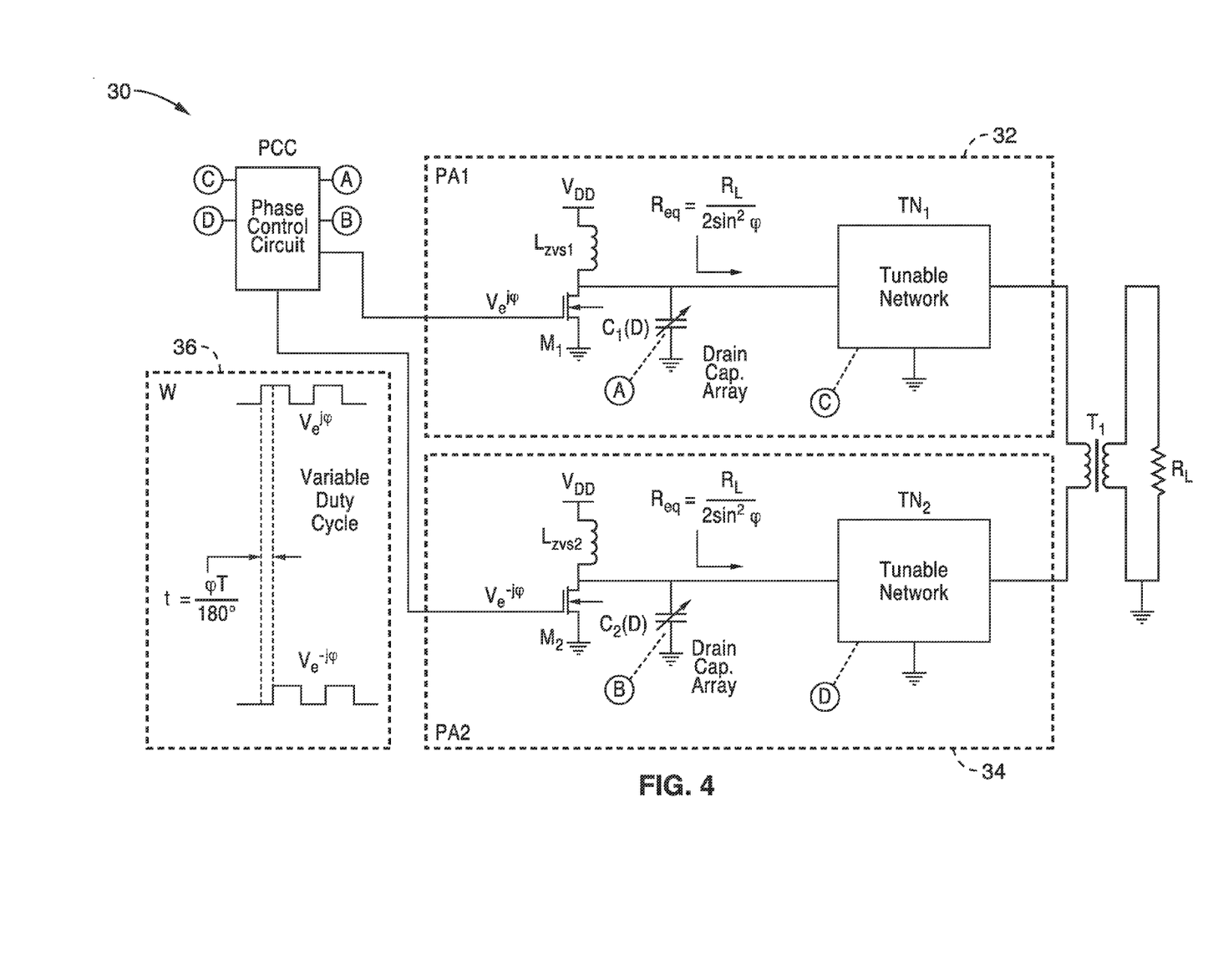
FIG. 4 is a schematic diagram of an outphasing ZVS contour-based power amplifier (PA) according to an embodiment of the present invention.

FIG. 4 illustrates an example embodiment 30 of the inventive ZVS contour based outphasing power amplifier network with PA1 32 and PA2 34 configured for receiving variable duty cycle drive signals shown in block 36. The output of PA1 32 and PA2 34 is coupled to a load, represented as $R_L$, through transformer $T_1$. It should be noted that other forms of power coupling can be alternatively utilized, without departing from the teachings of the present invention, including transmission lines, lumped element networks, and so forth which are forms of power combiner.

Driving signals $Ve^{j\phi}$ and $Ve^{-j\phi}$ have variable duty cycles and relative phase, and are seen generated by a phase control circuit (PCC). In addition, the driving signals $Ve^{j\phi}$ and $Ve^{-j\phi}$ can provide phase modulation To those versed in outphasing PA art, the block that generates the two waveforms is generally referred to as "signal component separator". In original outphasing art, this block was implemented using some kind of analog amplifier control; while in more modern implementations a digital signal processing block is generally followed by, or accompanied with, a frequency/phase synthesizer or a digital-to-phase converter. However, in addition to providing relative phase difference, the duty cycle of both waveforms in the present invention is also changed, and thus the phase control circuit shown differs significantly from the "signal component separator" of conventional outphasing designs.

Signals $Ve^{j\phi}$ and $Ve^{-j\phi}$ with variable duty cycles are received by first and second switching circuits, herein represented by transistors $M_1$ and $M_2$, with respective drain inductors $L_{zvs1}$ and $L_{zvs2}$, preferably of the same fixed value. Output from the switching stage is received by the variable drain capacitances $C_1(D)$ in PA1 and $C_2(D)$ PA2, as controlled by signals A and B from the phase control circuit. These signals are received by tunable networks $TN_1$ and $TN_2$, whose respective resistances are shown given by $R_L/2 \sin^2 \phi$, and whose impedance is controlled by signals C and D respectively from the phase control circuit PCC. According to at least one embodiment these tunable networks comprise at least a series and parallel LC network, or equivalent, an example of which is seen in FIG. 5.

The desired output power level (or desired back-off from nominal peak output power) is mapped appropriately to a chosen duty cycle D according to $g_3(D)$. The chosen duty cycle D is mapped appropriately according to $g_1(D)$ and $g_2(D)$ in controlling the value of the tunable networks, which preferably include variable capacitors. It should be noted that the load is typically not sensed in modern implementations to determine $\phi$, although sensing is not precluded. It should be appreciated that the duty cycle dynamically changed to achieve the desired envelope modulation. Furthermore, it should be appreciated that in at least one embodiment, the various component values, can also be changed dynamically to achieve the desired envelope modulation.

Figure 5:
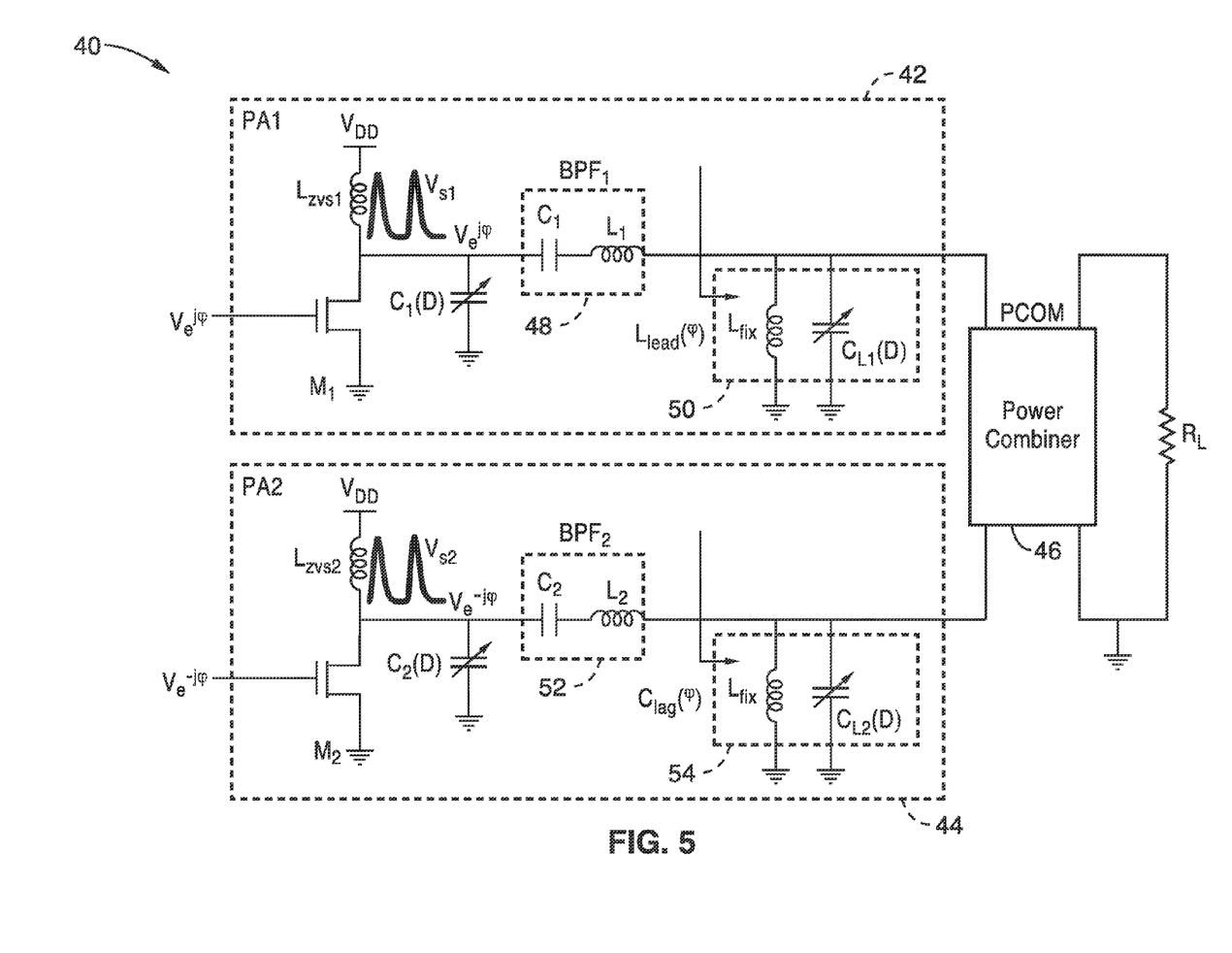
FIG. 5 is a schematic diagram of an outphasing ZVS contour-based power amplifier (PA) according to an embodiment of the present invention, showing elements within the tunable networks of FIG. 4.

FIG. 5 illustrates an example embodiment 40 of a wide dynamic range zero voltage switching (ZVS) contour based switching power amplifier having PA1 42 and PA2 44 in like manner as FIG. 4, yet showing the inductive and capacitive contributions within the tunable networks, and outputting to a power combiner (PCOM) 46 connected to a load, represented as $R_L$. For the sake of simplicity of illustration FIG. 5 does not depict the waveforms and phase control circuits shown in FIG. 4, although they are presumed to be utilized with this figure as well.

Signals $Ve^{j\phi}$ and $Ve^{-j\phi}$ with variable duty cycles, are received by first and second switching circuits, herein represented by transistors $M_1$ and $M_2$. Inductors $L_{zvs1}$ and $L_{zvs2}$, preferably of the same fixed value, are again seen in the drain connection to $V_{DD}$ power, with output waveforms $V_{S1}$ and $V_{S2}$ shown in the schematic. Output from the switching stage is received by the variable drain capacitances $C_1(D)$ in PA1 and $C_2(D)$ PA2 prior to reaching the bandpass filters BPF1 48 and BPF2 52, which are shown comprising capacitor $C_1$ in series with inductor $L_1$ in BPF1 and $C_2$ in series with inductor $L_2$ in BPF2. Output from the bandpass filters is input to an inductive lead circuit $L_{lead}(\phi)$ 50 in PA1 comprising parallel fixed inductor $L_{fix}$ and variable capacitor $C_{L1}(D)$, while in PA2 a capacitive lag circuit $C_{lag}(\phi)$ 54 is seen comprising parallel fixed inductor $L_{fix}$ and variable capacitor $C_{L2}(D)$. The output is directed to the load $R_L$ through a circuit here exemplified as a power combiner (PCOM) 46.

It should be appreciated that since the tunable network also provides overcoming stray parasitic capacitance and/or inductance, it requires more than a bandpass filter in combination with a variable load capacitance. It will be noted that in the absence of any stray parasitics, $Z_1$ and $Z_2$ would be capacitive and inductive (or vice versa). Since $C_{L1}(D)$ and $C_{L2}(D)$ are used to tune out the reactive portions of $Z_1$ and $Z_2$, they both can't be implemented as simple capacitor arrays. At least one of them has to include an inductor in parallel. In the presence of stray parasitics, such as from the transformer, then both $C_{L1}(D)$ and $C_{L2}(D)$ preferably comprise capacitor arrays in parallel with fixed inductors.

The following sections refer generally to FIG. 4 and FIG. 5. The variable capacitors of these inventive amplifiers can be implemented in any desired manner, such as comprising varactors, digital capacitor banks or combinations thereof. These digital capacitor banks are preferably implemented as parallel banks of capacitors of various sizes with series switches that could be turned ON or OFF, thus selecting or deselecting the capacitors. Digital circuits (e.g., dedicated logic circuits and/or memory blocks such as lookup tables) preferably map the digital duty cycle value D to a set of controls from which buffers/drivers accordingly drive the state of these switches. In at least one embodiment, the dedicated logic circuits and/or lookup tables themselves employ intelligence to overcome inevitable errors in the component values of the capacitor banks. Varactor-based implementations preferably employ additional control circuits, such as digital-to-analog converter circuits, to generate the appropriate control waveforms for the varactors. In either case, timing synchronization circuits (e.g., flip-flops) may be used in one or more embodiments to "time" the change of the capacitor value, which is an important consideration on providing a proper output.

Signals $Ve^{j\phi}$ and $Ve^{-\phi}$ arrive as digital inputs to the two PA circuits which are generated out of phase with one another by a time value t given by $t=\phi T/180°$, which is seen in the leftmost dashed block of FIG. 4, while T is the period of these first and second drive signals that drives the gates of switching stages in the PA circuits, exemplified by MOSFET transistor devices $M_1$ and $M_2$, although other forms of electrical switching elements may be utilized without departing from the teachings of the present invention. It will be noted that the switching stages of these PA circuits may alternatively comprise multiple transistors without departing from the teachings herein. The drain supplies of the switching stages, such as on the drain of transistors $M_1$ and $M_2$, are coupled to $V_{DD}$ power through preferably fixed inductors with value $L_{zvs}$, which are shown in FIG. 4 and FIG. 5 as $L_{zvs1}$ and $L_{zvs2}$ for the respective PAs. It will be noted that the inductor itself does not assure zero voltage switching, but operates in combination with the transformer combiner, the device capacitances, and the additional passive components (e.g., drain cap array and load cap array) so that the dynamics of the resultant network assures ZVS for a specific duty cycle D. The sources of these switching stages are coupled to ground, exemplified as the source lead of transistors $M_1$ and $M_2$ connected to ground. The outputs of the switching stages each have a parallel variable drain capacitor array C(D), which are shown in FIG. 4 and FIG. 5 as $C_1(D)$ and $C_2(D)$ for the respective PAs, preceding a tunable network, shown with parameters controlled by signals C and D, respectively for the first and second PA.

In at least one embodiment, the tunable networks comprise a series connected band-pass filter which determines the fundamental frequency and a parallel load inductance and variable load capacitor array $C_{L1}(D)$ and $C_{L2}(D)$ as clearly shown in FIG. 5. An inductive load $L_{load}$, and different variable load capacitor arrays $C_{L1}(D)$ and $C_{L2}(D)$ are preferably connected in parallel with the output of the bandpass filters, within the respective tunable networks. Output from the respective tunable networks drives the load, preferably through a power combiner, such as transformer $T_1$ which drives $R_L$.

The variable elements exemplified in FIG. 4 and FIG. 5, are controlled by an external circuit, with $C_1(D)$ and $C_2(D)$ variable capacitances controlled by a circuit such as exemplified by the phase control circuit PCC depicted in FIG. 4 outputting signals A and B in response to duty cycle. Additionally, signals C and D, of that figure are output for controlling characteristics of the respective tunable networks, such as controlling the tunable networks $TN_1$ and $TN_2$, and more specifically the value of variable capacitances $C_{L1}(D)$ and $C_{L2}(D)$ as seen in FIG. 5 that are part of tunable stages (networks). The value of variable capacitances $C_{L1}(D)$ and $C_{L2}(D)$ are controlled in response to selecting impedance values for the first and second PAs, these being determined for example using the equations for $Z_1$ and $Z_2$. In at least one embodiment, the signals A, B, C and D comprise digital buses controlling the respective capacitor arrays. It should be appreciated that the drain and load capacitor arrays may be of different sizes, whereby the number of control signals on the digital bus would also be different. In other words, the mappings from D to C(D), $C_{L1}(D)$ and $C_{L2}(D)$ can be different as required. These variable capacitances are preferably controlled digitally by a digital circuit, herein exemplified as being part of the phase control circuit (PCC) shown in FIG. 4.

It will be noted that the exemplified phase control circuit shown in FIG. 4, provides means for generating the first drive signal and the second drive signal at a desired duty cycle and varying the phase difference between the first drive signal and the second drive signal to maintain efficiency of the power amplifier apparatus in response to a varying output load. The phase control circuit also preferably includes pre-distortion logic in the control signals as is common in most PA circuits to correct linearity errors in the inventive power amplifier. In addition, the exemplified phase control circuit of this embodiment provides means for varying capacitances of the first variable drain capacitor array and the second variable drain capacitor array in response to duty cycle. Still further, the exemplified phase control circuit of this embodiment provides means for differentially varying capacitances of the first variable load capacitor array and the second variable load capacitor array in response to the duty cycle, the equations on $Z_1$ and $Z_2$ and the functioning of $g_1(D)$ and $g_2(D)$ as described. Said another way, for each output power level, there would be a corresponding set of relative phase, $2\phi$, duty cycle, D, C(D), $C_{L1}(D)$ and $C_{L2}(D)$. The interoperational relationship between these parameters is given by equations $Z_1$ and $Z_2$ and the functioning of $g_1(D)$ and $g_2(D)$ and $g_3(D)$.

One of ordinary skill in the art will appreciate that these control signals can be generated by a wide range of circuits, including computer processors (e.g., digital signal processor (DSP) chips), processor controlled devices, logic circuits and arrays (fixed & programmable), application specific integrated circuits (ASICs), and so forth.

In the embodiments shown, the drain capacitor bank C(D) (depicted as $C_1(D)$ and $C_2(D)$) comprises a digitally controlled capacitance which is varied as a function of duty cycle D. The minimum value of this drain capacitance is determined by transistor sizing considerations. The inductor $L_{zvs}$ (depicted as $L_{zvs1}$ and $L_{zvs2}$) is preferably fixed and its value determined using the function g1(D) for a 50% duty cycle. In order to eliminate the unwanted inductive and capacitive components of $Z_1$ and $Z_2$ a tunable impedance network consisting of two load capacitor banks, $C_{L1}(D)$ and $C_{L2}(D)$ and a fixed inductor $L_{load}$ are preferably utilized. Ideally, this architecture would yield upwards of 100% efficiency due to its ZVS contour based design and out-phasing arrangement. However, it is limited by the finite Q of the $L_{load}$ inductor, which presents a resistance $R_{stray}=Q^L_{load}\omega$ in parallel with the effective load resistance, $(R_L/2 \sin^2\phi)$. This effect becomes dominant only when $R_{stray}$ becomes comparable to $(R_L/2 \sin^2\phi)$. The load capacitor banks, $C_{L1}(D)$ and $C_{L2}(D)$, have almost negligible losses and hence have practically no effect on overall efficiency.

It should be understood that $Z_1$ and $Z_2$ are the respective impedances seen by the two power amplifiers, one is dominantly capacitive, and the other is dominated by inductance. The reactive components of $Z_1$ and $Z_2$ are tuned out by $C_{L1}(D)$ and $C_{L2}(D)$. By picking the relative phase $2\phi$, according to the duty cycle, it is assured that ZVS is maintained because the resistive portion changes with changes in $\phi$.

For instance, suppose $Z_1$ is capacitive and $Z_2$ is inductive. Then, the reactive part of $Z_2$ is tuned out simply by using a capacitor array, $C_{L2}(D)$. However, to tune out the reactive part of $Z_1$, a variable inductor is needed; which is generally not practical. So, instead, the combination of an inductor and a capacitor array $C_{L1}(D)$ is used to tune out capacitive $Z_1$.

In addition, the capacitor arrays can also be chosen to simultaneously tune out any unwanted inductive and capacitive components, which primarily comprise stray parasitics, for example parasitic capacitance of the transformer primary coils.

It should be appreciated that ZVS conditions may not be maintained for large values of back-off, in view of the practical limitations on how small a duty cycle can be realized. However, these larger back-off values are still attainable in response to reducing the relative phase $2\phi$, and accordingly changing the tunable networks as in a conventional outphasing PA with programmable termination. It will be appreciated, however, that ZVS conditions are no longer satisfied and efficiency drops for further back-off. Therefore, below the lowest achievable duty cycle, the architecture of the invention then operates in a manner more similar to a conventional outphasing PA, thus in this trade-off the present invention provides even further dynamic range as a trade-off with efficiency.

The advantages of the inventive PA circuit are multifold and readily apparent, as a solution which maintains constant drain efficiency over a wide dynamic range. The design offers not only constant efficiency but also improves upon the dynamic range. It will be noted that the inventive PA architecture allows wide modulation bandwidths and is free from many of the problems faced by traditional PA architectures, such as envelope-phase mismatch common to polar architectures that is significantly alleviated by the absence of an explicit envelope filter.

The inventive circuit has been verified using realistic transistor level circuit simulation in 0.13 µm CMOS. Realistic models for passives have been obtained from ASITIC which stands for Analysis and Simulation of Spiral Inductors and Transformers for ICs, which were used in the simulations. The architecture has also been verified (without modulation) using measurements on 100 MHz discrete PAs. The relative phase 2φ was swept in a static sense and the duty cycle D and the variable components were changed accordingly and was shown that efficiency remains high and relatively constant.

The increasing sophistication of wireless communication technologies, particularly in power conscious portable devices, has made efficient, wide bandwidth, linear power amplifiers (PAs) that handle high peak-to-average signal power ratios (PAR) critically important. In any transmitter chain, the power amplifiers are the major source of power consumption, and alone account for about 70-80% of total power consumption in any transmitter chip. The inventive power amplifier maintains close to peak efficiency over the wide dynamic range of modulation schemes and achieves significant battery power conservation. The invention makes it possible to efficiently generate high power, wide bandwidth modulated radio frequency signals from low voltage supplies with a high degree of linearity The invention can be utilized in great benefit in power control applications where high speed modulation is not required (e.g., no modulation or very low modulation) but simple back-off is desired. For example, the invention would be particularly well-suited for use in cellular and other wireless transceivers.

From the discussion above it will be appreciated that the invention can be embodied in various ways, including the following:

1. A zero-voltage-switching contour based outphasing power amplifier apparatus, comprising: (a) a first power amplifier configured to receive a first drive signal at an input and having an output configured for connection to a first side of a load, said first power amplifier comprising: a first transistor switching stage configured to be driven by said first drive signal; a first zero voltage switching inductance having a fixed value on the drain of said first transistor switching stage; a first variable drain capacitor array coupled in parallel to an output from said first transistor switching stage; a first bandpass filter in series with the output from said first transistor switching stage; a first variable load capacitor array coupled in parallel to an output from said first bandpass filter; and a first load inductance having a fixed value coupled in parallel to the output from said first bandpass filter; (b) a second power amplifier configured to receive a second drive signal at an input and having an output configured for connection to a second side of the load, said second power amplifier comprising: a second transistor switching stage configured to be driven by said second drive signal; a second zero voltage switching inductance having a fixed value on the drain of said first transistor switching stage; a second variable drain capacitor array coupled in parallel to an output from said second transistor switching stage and having capacitance which is varied as a function of duty cycle; a second bandpass filter in series with said output from said second transistor switching stage; a second variable load capacitor array coupled in parallel to an output from said second bandpass filter; and a second load inductance having a fixed value coupled in parallel to an output from said second bandpass filter; (c) means for generating said first drive signal and said second drive signal at a desired duty cycle and varying the phase difference between said first drive signal and said second drive signal to maintain efficiency of said power amplifier apparatus in response to a varying output load; (d) means for varying capacitances of said first variable drain capacitor array and said second variable drain capacitor array in response to duty cycle; and (e) means for differentially varying capacitances of said first variable load capacitor array and said second variable load capacitor array in response to determining impedance values for said first power amplifier and said second power amplifier.

2. The apparatus of any of the preceding embodiments, wherein said means for varying capacitances of said first variable drain capacitor array and said second variable drain capacitor array comprises a digital control circuit.

3. The apparatus of any of the preceding embodiments, wherein said means for differentially varying capacitances of said first variable load capacitor array and said second variable load capacitor array comprises a control circuit.

4. The apparatus of any of the preceding embodiments, wherein said means for generating said first drive signal and said second drive signal at a desired duty cycle and varying the duty cycle comprises a control circuit.

5. The apparatus of any of the preceding embodiments, wherein said phase difference results in a time difference between said first and second drive signals given by t=φT/180°, in which t is time between corresponding edges in said first and second drive signals, while T is wavelength period for these first and second drive signals.

6. The apparatus of any of the preceding embodiments, wherein said phase difference between said first drive signal and said second drive signal presents an effective impedance of $Z_1$ to said first power amplifier and $Z_2$ to said second power amplifier, given by, $$Z_1 = \frac{(V\cos\varphi + jV\sin\varphi)}{j2V\sin\varphi} R_L$$
$$= \frac{R_L}{2}(1 - j\cot\varphi)$$

$$Z_2 = \frac{(-V\cos\varphi + jV\sin\varphi)}{j2V\sin\varphi} R_L$$
$$= \frac{R_L}{2}(1 + j\cot\varphi)$$

in which V is input voltage level, $R_L$ is load resistance, and j refers to this being in the imaginary number plane, and φ is said phase difference.

7. The apparatus of any of the preceding embodiments, wherein said first drive signal and said second drive signal are out of phase with one another by a phase difference of 2φ.

8. The apparatus of any of the preceding embodiments, wherein peak efficiency is maintained even under back-off conditions in response to selection of component values assuring zero voltage switching (ZVS) conditions are met at varying duty cycles.

9. The apparatus of any of the preceding embodiments, wherein selecting component values involves varying the drain capacitance C and the equivalent resistance for a fixed $L_{zvs}$ along with variation of said duty cycle based on the load.

10. The apparatus of any of the preceding embodiments, wherein values of drain capacitance C and equivalent resistance $R_{eq}$ are selected for a fixed zero voltage switching transistor drain inductance $L_{zvs}$ with duty cycle D according to $$\frac{\omega_0 L_{ZVS}}{R_{eq}} = g_1(D)$$

and $$\omega_0 C R_{eq} = g_2(D)$$

in which $g_1(D)$ and $g_2(D)$ are determined to ensure ZVS switching.

11. The apparatus of any of the preceding embodiments, further comprising a transformer, with a first winding having a first end coupled to the output of said first power amplifier and a second end coupled to the output of said second power amplifier, and a second winding, magnetically coupled to said first winding, configured for driving the load.

12. A zero-voltage-switching contour based outphasing power amplifier apparatus, comprising: (a) a first power amplifier configured to receive a first drive signal at an input and having an output configured for connection to a first side of a load, said first power amplifier comprising: a first transistor switching stage configured to be driven by said first drive signal; a first zero voltage switching inductance having a fixed value on the drain of said first transistor switching stage; a first variable drain capacitor array coupled in parallel to an output from said first transistor switching stage; a first bandpass filter in series with the output from said first transistor switching stage; a first variable load capacitor array coupled in parallel to an output from said first bandpass filter; and a first load inductance having a fixed value coupled in parallel to the output from said first bandpass filter; (b) a second power amplifier configured to receive a second drive signal at an input and having an output configured for connection to a second side of the load, said second power amplifier comprising: a second transistor switching stage configured to be driven by said second drive signal; a second zero voltage switching inductance having a fixed value on the drain of said first transistor switching stage; a second variable drain capacitor array coupled in parallel to an output from said second transistor switching stage and having capacitance which is varied as a function of duty cycle; a second bandpass filter in series with said output from said second transistor switching stage; a second variable load capacitor array coupled in parallel to an output from said second bandpass filter; and a second load inductance having a fixed value coupled in parallel to an output from said second bandpass filter; (c) a digital control circuit for generating said first drive signal and said second drive signal at a desired duty cycle and varying the phase difference between said first drive signal and said second drive signal to maintain efficiency of said power amplifier apparatus in response to a varying output load; (d) a control circuit for varying capacitances of said first variable drain capacitor array and said second variable drain capacitor array in response to duty cycle; and (e) a control circuit for differentially varying capacitances of said first variable load capacitor array and said second variable load capacitor array in response to determining impedance values for said first power amplifier and said second power amplifier; (f) wherein peak efficiency of said power amplifier apparatus is maintained even under back-off conditions so that zero voltage switching (ZVS) conditions are met at varying duty cycles.

13. The apparatus of any of the preceding embodiments, wherein said phase difference results in a time difference between said first and second drive signals given by $t=\phi T/180°$, in which t is time between corresponding edges in said first and second drive signals, while T is the period of these first and second drive signals.

14. The of any of the preceding embodiments, wherein said phase difference between said first drive signal and said second drive signal presents an effective impedance of $Z_1$ to said first power amplifier and $Z_2$ to said second power amplifier, given by, $$Z_1 = \frac{(V\cos\varphi + jV\sin\varphi)}{j2V\sin\varphi} R_L$$
$$= \frac{R_L}{2}(1 - j\cot\varphi)$$
$$Z_2 = \frac{(-V\cos\varphi + jV\sin\varphi)}{j2V\sin\varphi} R_L$$
$$= \frac{R_L}{2}(1 + j\cot\varphi)$$

in which V is the input voltage level, $R_L$ is load resistance, and j refers to this being in the imaginary number plane.

15. The apparatus of any of the preceding embodiments, wherein said first drive signal and said second drive signal are out of phase with one another by a phase difference of $2\phi$.

16. The apparatus of any of the preceding embodiments, wherein selecting component values involves varying the drain capacitance C and the equivalent resistance for a fixed $L_{zvs}$ along with variation of said duty cycle based on the load.

17. The apparatus of any of the preceding embodiments, wherein values of drain capacitance C and equivalent resistance $R_{eq}$ are selected for a fixed zero voltage switching transistor drain inductance $L_{zvs}$ with duty cycle D according to $$\frac{\omega_0 L_{ZVS}}{R_{eq}} = g_1(D)$$

and $\omega_0 C R_{eq} = g_2(D)$ in which $g_1(D)$ and $g_2(D)$ are determined to ensure ZVS switching.

18. The apparatus of any of the preceding embodiments, further comprising a transformer, with a first winding having a first end coupled to said first power amplifier and a second end coupled to said second power amplifier, and a second winding, magnetically coupled to said first winding, and configured for driving the load.

19. A zero-voltage-switching contour based outphasing power amplifier apparatus, comprising: a first power amplifier having a switching transistor with a drain inductor for zero voltage switching, said first power amplifier configured to receive a first drive signal at an input and having an output configured for connection to a first side of a load; a second power amplifier having a switching transistor with a drain inductor for zero voltage switching, said second power amplifier configured to receive a second drive signal at an input and having an output configured for connection to a second side of the load; a variable drain capacitor array coupled in parallel on an output of the switching transistor in each of said first and second power amplifier, wherein capacitance of said variable drain capacitor array is varied in response to duty cycle; a variable load capacitor array coupled in parallel at the output of said first and second power amplifier near the load, wherein capacitance of said variable load capacitor array are varied differently on said first and said second power amplifier in response to determining impedance values for said first power amplifier and said second power amplifier; and a bandpass filter within said first power amplifier and said second power amplifier coupled between said variable drain capacitor array and said variable load capacitor array; wherein efficiency of said power amplifier apparatus is maintained despite a varying output load, in response to receiving said first drive signal and said second drive signal with a phase difference that is responsive to load conditions.

20. The apparatus of any of the preceding embodiments, further comprising a digital control circuit for generating said first drive signal and said second drive signal, and adjusting the capacitance of said variable drain capacitor arrays in response to load, and separately adjusting the capacitance of said variable load capacitor array in response to determining impedance values for said first power amplifier and said second power amplifier.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A zero-voltage-switching contour based outphasing power amplifier apparatus, comprising:
    (a) a first power amplifier configured to receive a first drive signal at an input and having an output configured for connection to a first side of a load, said first power amplifier comprising:
        a first transistor switching stage configured to be driven by said first drive signal;
        a first zero voltage switching inductance having a fixed value on the drain of said first transistor switching stage;
        a first variable drain capacitor array coupled in parallel to an output from said first transistor switching stage;
        a first bandpass filter in series with the output from said first transistor switching stage;
        a first variable load capacitor array coupled in parallel to an output from said first bandpass filter; and
        a first load inductance having a fixed value coupled in parallel to the output from said first bandpass filter;
    (b) a second power amplifier configured to receive a second drive signal at an input and having an output configured for connection to a second side of the load, said second power amplifier comprising:
        a second transistor switching stage configured to be driven by said second drive signal;
        a second zero voltage switching inductance having a fixed value on the drain of said first transistor switching stage;
        a second variable drain capacitor array coupled in parallel to an output from said second transistor switching stage and having capacitance which is varied as a function of duty cycle;
        a second bandpass filter in series with said output from said second transistor switching stage;
        a second variable load capacitor array coupled in parallel to an output from said second bandpass filter; and
        a second load inductance having a fixed value coupled in parallel to an output from said second bandpass filter;
    (c) means for generating said first drive signal and said second drive signal at a desired duty cycle and varying the phase difference between said first drive signal and said second drive signal to maintain efficiency of said power amplifier apparatus in response to a varying output load;
    (d) means for varying capacitances of said first variable drain capacitor array and said second variable drain capacitor array in response to duty cycle; and
    (e) means for differentially varying capacitances of said first variable load capacitor array and said second variable load capacitor array in response to determining impedance values for said first power amplifier and said second power amplifier.

2. The apparatus recited in claim 1, wherein said means for varying capacitances of said first variable drain capacitor array and said second variable drain capacitor array comprises a digital control circuit.

3. The apparatus recited in claim 1, wherein said means for differentially varying capacitances of said first variable load capacitor array and said second variable load capacitor array comprises a control circuit.

4. The apparatus recited in claim 1, wherein said means for generating said first drive signal and said second drive signal at a desired duty cycle and varying the duty cycle comprises a control circuit.

5. The apparatus recited in claim 1, wherein said phase difference results in a time difference between said first and second drive signals given by $t=\phi T/180°$, in which t is time between corresponding edges in said first and second drive signals, while T is wavelength period for these first and second drive signals.

6. The apparatus recited in claim 5, wherein said phase difference between said first drive signal and said second drive signal presents an effective impedance of $Z_1$ to said first power amplifier and $Z_2$ to said second power amplifier, given by, $$Z_1 = \frac{(V\cos\varphi + jV\sin\varphi)}{j2V\sin\varphi}R_L$$
$$= \frac{R_L}{2}(1 - j\cot\varphi)$$
$$Z_2 = \frac{(-V\cos\varphi + jV\sin\varphi)}{j2V\sin\varphi}R_L$$
$$= \frac{R_L}{2}(1 + j\cot\varphi)$$

in which V is input voltage level, $R_L$ is load resistance, and j refers to this being in the imaginary number plane, and $\phi$ is said phase difference.

7. The apparatus recited in claim 1, wherein said first drive signal and said second drive signal are out of phase with one another by a phase difference of 2φ.

8. The apparatus recited in claim 1, wherein peak efficiency is maintained even under back-off conditions in response to selection of component values assuring zero voltage switching (ZVS) conditions are met at varying duty cycles.

9. The apparatus recited in claim 8, wherein selecting component values involves varying the drain capacitance C and the equivalent resistance for a fixed $L_{zvs}$ along with variation of said duty cycle based on the load.

10. The apparatus recited in claim 8, wherein values of drain capacitance C and equivalent resistance $R_{eq}$ are selected for a fixed zero voltage switching transistor drain inductance $L_{zvs}$ with duty cycle D according to $$\frac{\omega_0 L_{ZVS}}{R_{eq}} = g_1(D)$$

and $$\omega_0 C R_{eq} = g_2(D)$$

in which $g_1(D)$ and $g_2(D)$ are determined to ensure ZVS switching.

11. The apparatus recited in claim 1, further comprising a transformer, with a first winding having a first end coupled to the output of said first power amplifier and a second end coupled to the output of said second power amplifier, and a second winding, magnetically coupled to said first winding, configured for driving the load.

12. A zero-voltage-switching contour based outphasing power amplifier apparatus, comprising:
   (a) a first power amplifier configured to receive a first drive signal at an input and having an output configured for connection to a first side of a load, said first power amplifier comprising:
      a first transistor switching stage configured to be driven by said first drive signal;
      a first zero voltage switching inductance having a fixed value on the drain of said first transistor switching stage;
      a first variable drain capacitor array coupled in parallel to an output from said first transistor switching stage;
      a first bandpass filter in series with the output from said first transistor switching stage;
      a first variable load capacitor array coupled in parallel to an output from said first bandpass filter; and
      a first load inductance having a fixed value coupled in parallel to the output from said first bandpass filter;
   (b) a second power amplifier configured to receive a second drive signal at an input and having an output configured for connection to a second side of the load, said second power amplifier comprising:
      a second transistor switching stage configured to be driven by said second drive signal;
      a second zero voltage switching inductance having a fixed value on the drain of said first transistor switching stage;
      a second variable drain capacitor array coupled in parallel to an output from said second transistor switching stage and having capacitance which is varied as a function of duty cycle;
      a second bandpass filter in series with said output from said second transistor switching stage;
      a second variable load capacitor array coupled in parallel to an output from said second bandpass filter; and
      a second load inductance having a fixed value coupled in parallel to an output from said second bandpass filter;
   (c) a digital control circuit for generating said first drive signal and said second drive signal at a desired duty cycle and varying the phase difference between said first drive signal and said second drive signal to maintain efficiency of said power amplifier apparatus in response to a varying output load;
   (d) a control circuit for varying capacitances of said first variable drain capacitor array and said second variable drain capacitor array in response to duty cycle; and
   (e) a control circuit for differentially varying capacitances of said first variable load capacitor array and said second variable load capacitor array in response to determining impedance values for said first power amplifier and said second power amplifier;
   (f) wherein peak efficiency of said power amplifier apparatus is maintained even under back-off conditions so that zero voltage switching (ZVS) conditions are met at varying duty cycles.

13. The apparatus recited in claim 12, wherein said phase difference results in a time difference between said first and second drive signals given by t=φT/180°, in which t is time between corresponding edges in said first and second drive signals, while T is the period of these first and second drive signals.

14. The apparatus recited in claim 13, wherein said phase difference between said first drive signal and said second drive signal presents an effective impedance of $Z_1$ to said first power amplifier and $Z_2$ to said second power amplifier, given by, $$Z_1 = \frac{(V\cos\varphi + jV\sin\varphi)}{j2V\sin\varphi} R_L$$

$$= \frac{R_L}{2}(1 - j\cot\varphi)$$

$$Z_2 = \frac{(-V\cos\varphi + jV\sin\varphi)}{j2V\sin\varphi} R_L$$

$$= \frac{R_L}{2}(1 + j\cot\varphi)$$

in which V is the input voltage level, $R_L$ is load resistance, and j refers to this being in the imaginary number plane.

15. The apparatus recited in claim 12, wherein said first drive signal and said second drive signal are out of phase with one another by a phase difference of 2φ.

16. The apparatus recited in claim 15, wherein selecting component values involves varying the drain capacitance C and the equivalent resistance for a fixed $L_{zvs}$ along with variation of said duty cycle based on the load.

17. The apparatus recited in claim 15, wherein values of drain capacitance C and equivalent resistance $R_{eq}$ are selected for a fixed zero voltage switching transistor drain inductance $L_{zvs}$ with duty cycle D according to $$\frac{\omega_0 L_{ZVS}}{R_{eq}} = g_1(D)$$

and $$\omega_0 C R_{eq} = g_2(D)$$

in which $g_1(D)$ and $g_2(D)$ are determined to ensure ZVS switching.

18. The apparatus recited in claim 12, further comprising a transformer, with a first winding having a first end coupled to said first power amplifier and a second end coupled to said second power amplifier, and a second winding, magnetically coupled to said first winding, and configured for driving the load.

19. A zero-voltage-switching contour based outphasing power amplifier apparatus, comprising:
- a first power amplifier having a switching transistor with a drain inductor for zero voltage switching, said first power amplifier configured to receive a first drive signal at an input and having an output configured for connection to a first side of a load;
- a second power amplifier having a switching transistor with a drain inductor for zero voltage switching, said second power amplifier configured to receive a second drive signal at an input and having an output configured for connection to a second side of the load;
- a variable drain capacitor array coupled in parallel on an output of the switching transistor in each of said first and second power amplifier, wherein capacitance of said variable drain capacitor array is varied in response to duty cycle;
- a variable load capacitor array coupled in parallel at the output of said first and second power amplifier near the load, wherein capacitance of said variable load capacitor array are varied differently on said first and said second power amplifier in response to determining impedance values for said first power amplifier and said second power amplifier; and
- a band-pass filter within said first power amplifier and said second power amplifier coupled between said variable drain capacitor array and said variable load capacitor array;
- wherein efficiency of said power amplifier apparatus is maintained despite a varying output load, in response to receiving said first drive signal and said second drive signal with a phase difference that is responsive to load conditions.

20. The apparatus recited in claim 19, further comprising a digital control circuit for generating said first drive signal and said second drive signal, and adjusting the capacitance of said variable drain capacitor arrays in response to load, and separately adjusting the capacitance of said variable load capacitor array in response to determining impedance values for said first power amplifier and said second power amplifier.

* * * * *